(12) United States Patent
Jeong et al.

(10) Patent No.: US 6,707,142 B2
(45) Date of Patent: Mar. 16, 2004

(54) PACKAGE STACKED SEMICONDUCTOR DEVICE HAVING PIN LINKING MEANS

(75) Inventors: Do-Soo Jeong, Suwon (KR); Wan-Gyun Choi, Yongyin-si (KR)

(73) Assignee: Barun Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/251,762

(22) Filed: Sep. 23, 2002

(65) Prior Publication Data

US 2003/0201529 A1 Oct. 30, 2003

(30) Foreign Application Priority Data

Apr. 24, 2002 (KR) .................. 20-2002-0012453
Aug. 6, 2002 (KR) .................. 20-2002-0023474

(51) Int. Cl.$^7$ .............................................. H01L 23/02
(52) U.S. Cl. ........................................ 257/686; 257/697

(58) Field of Search ............................. 257/786, 777, 257/723, 724, 693, 694, 695, 697, 691

(56) References Cited

U.S. PATENT DOCUMENTS 4,398,235 A * 8/1983 Lutz et al.
6,462,408 B1 * 10/2002 Wehrly, Jr.
6,572,387 B2 * 6/2003 Burns et al.

* cited by examiner

Primary Examiner—Sheila V. Clark
(74) Attorney, Agent, or Firm—Robert E. Bushnell, Esq.

(57) ABSTRACT

A package stacked semiconductor device includes a plurality of pin linking means for electrically connecting at least one of control signal pins of one package to its neighbor NC pin of the same package. Either of the control signal pin or the neighbor NC pin, which are electrically interconnected, is electrically connected to the corresponding pin of the next package.

16 Claims, 11 Drawing Sheets

PACKAGE STACKED SEMICONDUCTOR DEVICE HAVING PIN LINKING MEANS

BACKGROUND OF THE INVENTION

1. Field of the Invention

This invention relates to stacking technology of semiconductor package devices, and more particularly, a package stacked semiconductor device having pin linking means for operating a plurality of package devices as a single semiconductor device.

2. Description of the Related Art

One of methods to improve capacity of a semiconductor IC (Integrated Circuit) device is stacking several chips or packages into a single device. The stacking of IC devices is necessary as well for improving mounting density required as the chip size increases according to the improvement in density and performance of the IC devices. The stacked semiconductor device can be divided into: a chip stacked device in which unpackaged bare chips are stacked, and a package stacked device with assembled package devices being stacked.

In the conventional package stacked semiconductor device, e.g., as disclosed in U.S. Pat. No. 5,313,096, a number of packages are stacked vertically on a lead frame and electrode pads of the upper and lower packages are electrically interconnected by a solder strip, or as disclosed in U.S. Pat. No. 5,978,227, an intermediate lead frame or PCB is provided between upper and lower packages for the electrical interconnection of the upper and lower packages with the first terminals of the intermediate lead frame being connected to outer leads of the upper package and the second terminals of the intermediate lead frame being connected to outer leads of the lower package.

The conventional device requires additional components such as a solder strip or an intermediate lead frame for stacking packages. Conventional package stacked device shown in FIG. 1 has the additional components within individual package device.

FIG. 1 shows the structure disclosed in U.S. Pat. No. 6,242,285 entitled "Stacked Package of Semiconductor Package Units Via Direct Connection Between Leads and Stacking Method Therefor", in which leads $PI_A$, $PI_B$, . . . of upper and lower packages $IC_B$ and $IC_A$ are directly connected in one-to-one fashion. For operation of the stacked package, the length of a part of leads i.e., a lead $P19_B$ of the upper package $IC_B$ is shortened to be disconnected from corresponding lead $P19_A$ of the lower package. The $P19_B$ lead is electrically interconnected to $P15_A$ lead of the lower package through an additional component within the package. The electrical connection between leads $P19_A$ and $P15_A$ may be formed either through the modification of lead frame structure where a bus bar lead $419_B$ is modified to directly connect CS lead 15 and an external NC lead 19 of the upper package $IC_B$ as shown in FIG. 1b or through a jump wire $319JP_B$ connecting the CS lead 15 and the external NC lead 19 as shown in FIG. 1c. The jump wire $319JP_B$ is different from the wires $312_B$ and $319_B$ connecting leads and chip electrode pads in that it connects the leads.

The conventional stacked package device using the direct stacking technology (DST) has an advantage that memory capacity of a memory module can be improved without special consideration of the design.

However, the conventional stacked devices require the modifications of internal structure (e.g., lead frame leads) or additional bonding wires (e.g., the jumper wires). Further, the conventional stacked device where the additional structure is formed externally to the package entails the increase of costs and results in complexity of processing step for introducing solder strips and intermediate lead frame.

SUMMARY OF THE INVENTION

It is an object of this invention to implement more simply and more easily a package stacked semiconductor device.

Other object of this invention is to provide a simple manufacturing process of package stacked semiconductor devices with an increased productivity.

According to one aspect of this invention, a package stacked semiconductor device is implemented by stacking upper and lower packages, each having a semiconductor IC chip with a plurality of electrode pads on its active surface, a plurality of conductive leads for electrically connecting the electrode pads to external devices, and a package body for encapsulating the semiconductor chip and parts of the leads. The conductive leads include power pins, data pins for inputting and outputting to and from the semiconductor IC chip, control signal pins and NC pins. The stacked device includes a plurality of pin connection parts for electrically connecting the conductive leads of the upper package to the respective corresponding conductive leads of the lower package. The plurality of conductive leads of the upper package include at least one control signal pin connected to neighboring NC pin by a pin linking means instead of the pin connection parts. The at least one control pin is electrically interconnected to an NC pin of the lower package, which corresponds to the neighboring NC pin of the upper package.

In the present invention, the pin linking means can be implemented by a jumper having a central perforated part (or a through hole), a jumper means having opening at both sides of conductive body, a jumper having one or two parallel through grooves, and a ribbon wire connected to inner leads. The pin linking means can be formed by re-forming or bending the at least one control signal pin to directly contact the neighboring NC pin of the upper package.

According to other aspect of the present invention, a package stacked semiconductor device comprising: an upper package and a lower package, each having a semiconductor chip provided with a plurality of electrode pads, a plurality of conductive leads for electrically connecting the electrode pads to external world and a package body for encapsulating the semiconductor chip and a part of the conductive leads; the plurality of conductive leads including power pins for power signal for the semiconductor chips, data pins for inputting and outputting data to and from the semiconductor chips, control signal pins and extra no connection (NC) pins; a plurality of pin connection parts for directly connecting the plurality of conductive leads of the upper and lower packages by the power pins, data pins and control signal pins; and the plurality of conductive leads of the upper package including at least one control pin connected to neighboring NC pin by a dam bar, one of the at least one control pin and the neighboring NC pin having a shortened length to be disconnected from a corresponding pin of the lower package, and the other of the at least one control pin and the neighboring NC pin being directly and electrically connected to a corresponding pin of the lower package. The at least one control signal pin is made shortened to be disconnected from the NC pin of the lower package that corresponds to the neighboring NC pin of the upper package.

In one embodiment of the present invention, by using a bridge lead formed at a distant location from a dam bar of the upper package toward the outer leads, an NC pin of the upper package can be electrically interconnected to neighboring control pin.

BRIEF DESCRIPTION OF THE DRAWINGS

These and other objects, features and advantages of the present invention will be readily understood from the detailed description that follows, with reference to the accompanying drawings, in which like reference numerals designate like structural elements, and in which:

FIG. 1b is a cross-sectional plan view for showing an example of package connection in the conventional device of FIG. 1a;

FIG. 1c is a cross-sectional plan view for showing another example of package connection in the conventional device of FIG. 1a;

FIG. 2b is a side view of the device of FIG. 2a;

FIG. 4b is a partial enlarged view of the stacked device of FIG. 4a, while

FIG. 7b is a front side view of FIG. 7a;

DETAILED DESCRIPTION

FIG. 2 illustrates the structure of package stacked semiconductor device according to first embodiment of the present invention.

A package stacked semiconductor device 200 is formed by stacking an upper package 210A and a lower package 210B. The upper and lower packages may have semiconductor chips of the same structure and function. The semiconductor chip (not shown) has a plurality of electrode pads formed on an active surface. The electrode pads are for electrical connection of the IC chips to external world. The upper and lower packages of the stacked device 200 are stacked in a direction that the active surfaces of the two IC chips towards the same direction e.g., upward direction in FIG. 2a. Each of the upper and lower packages may be normal packages and DDPs (Dual Die Packages).

Figure 1A:
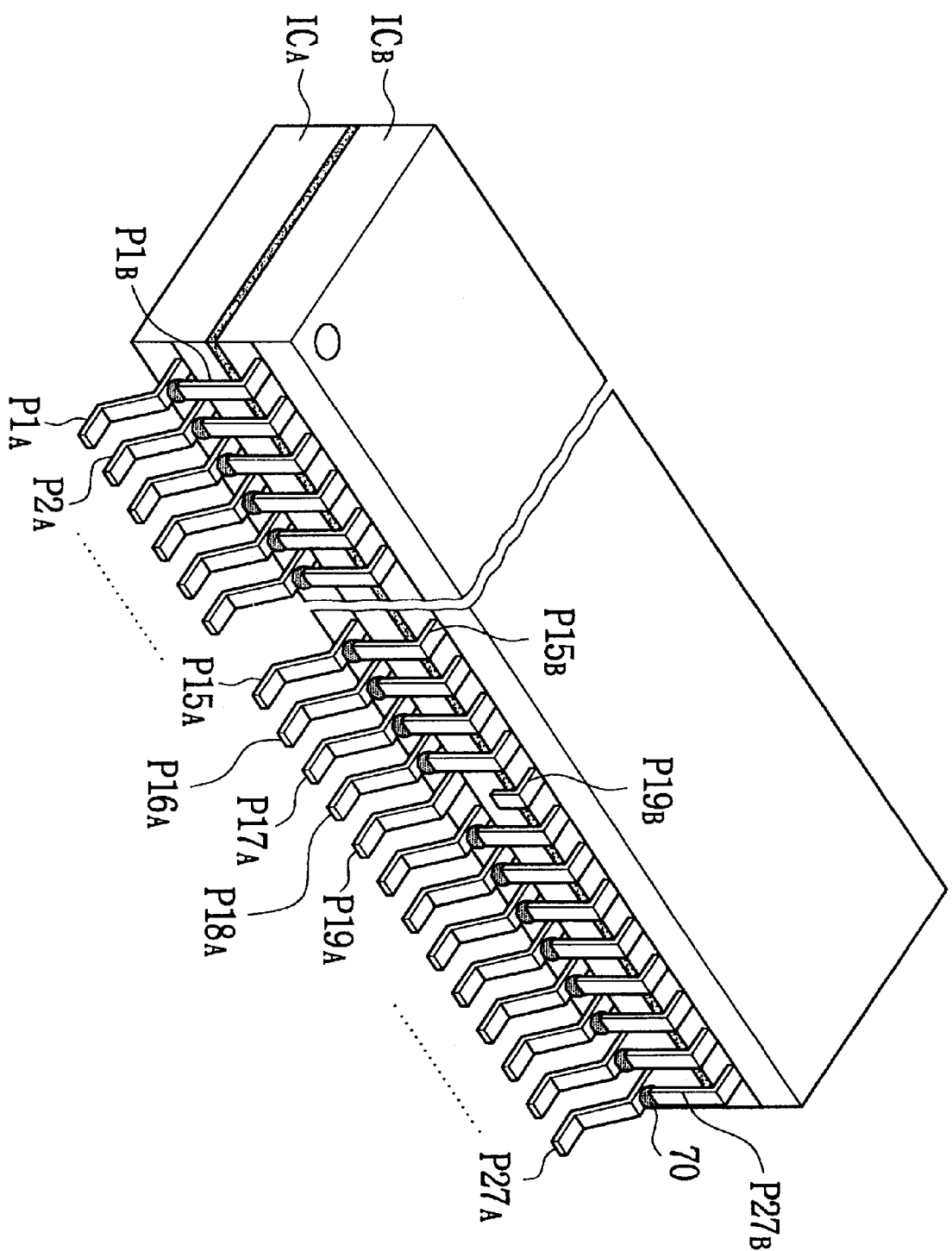
FIG. 1a is a perspective view of a conventional package stacked semiconductor device.
Figure 1B:
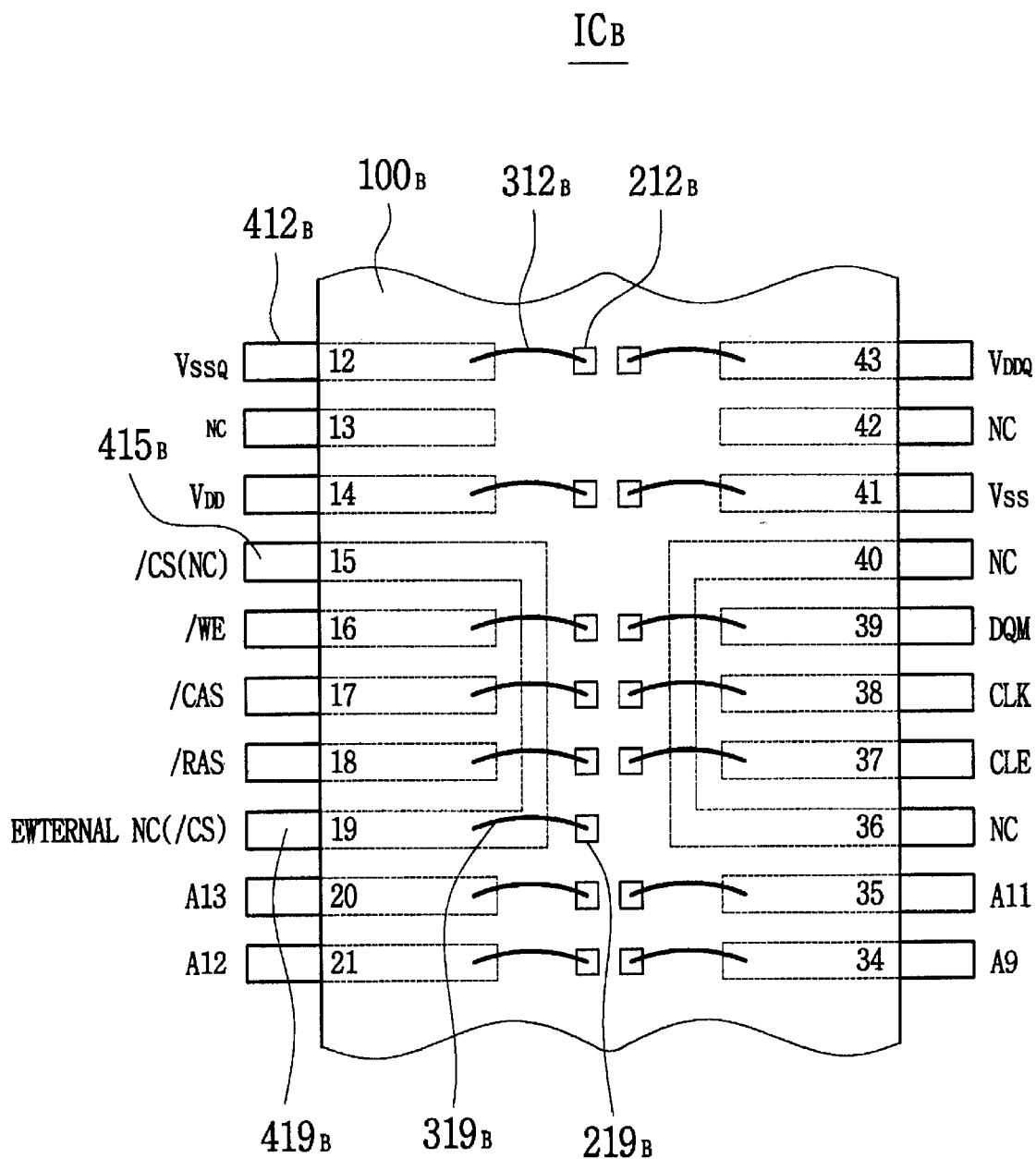
Figure 1C:
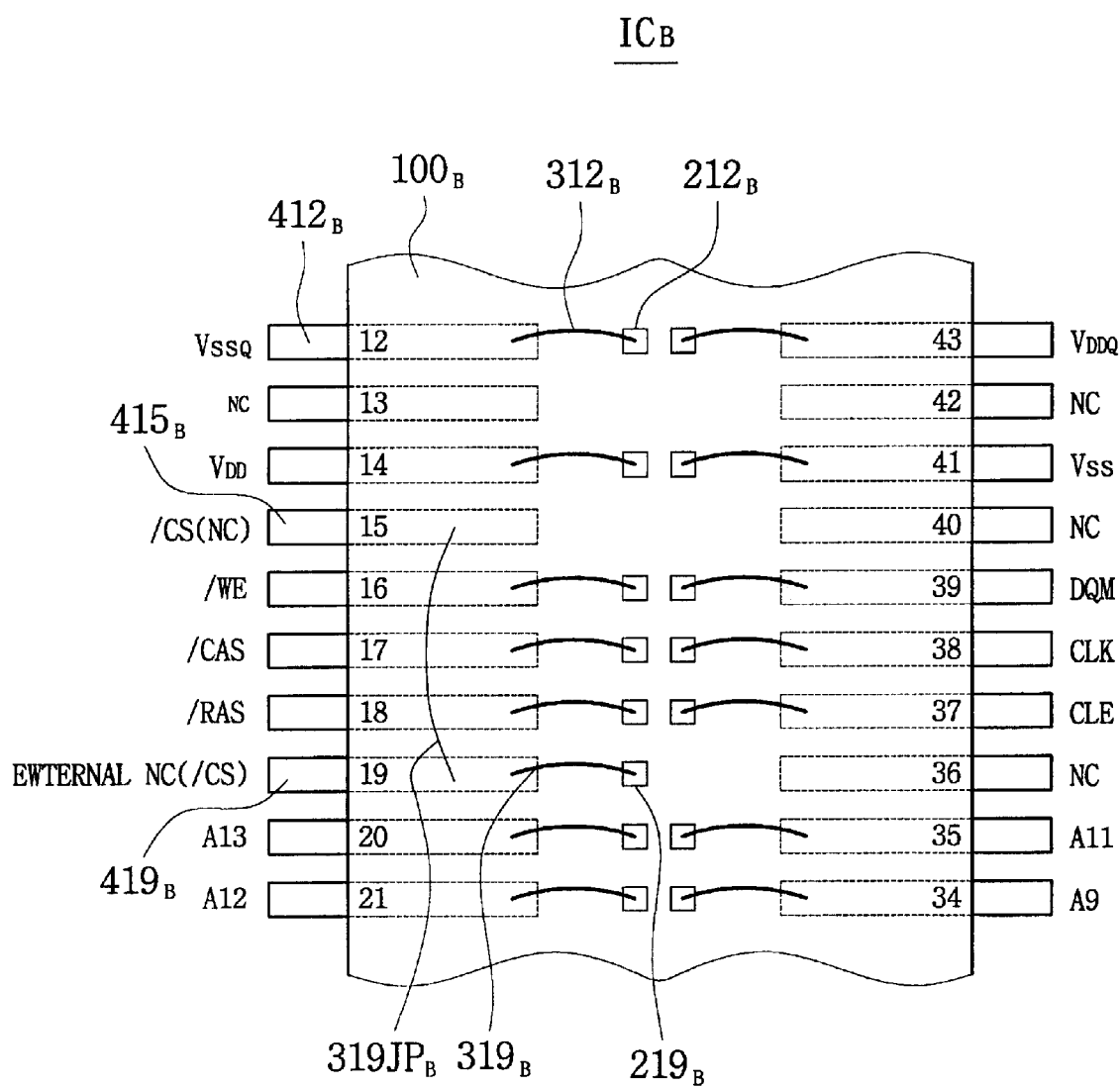
Figure 2A:
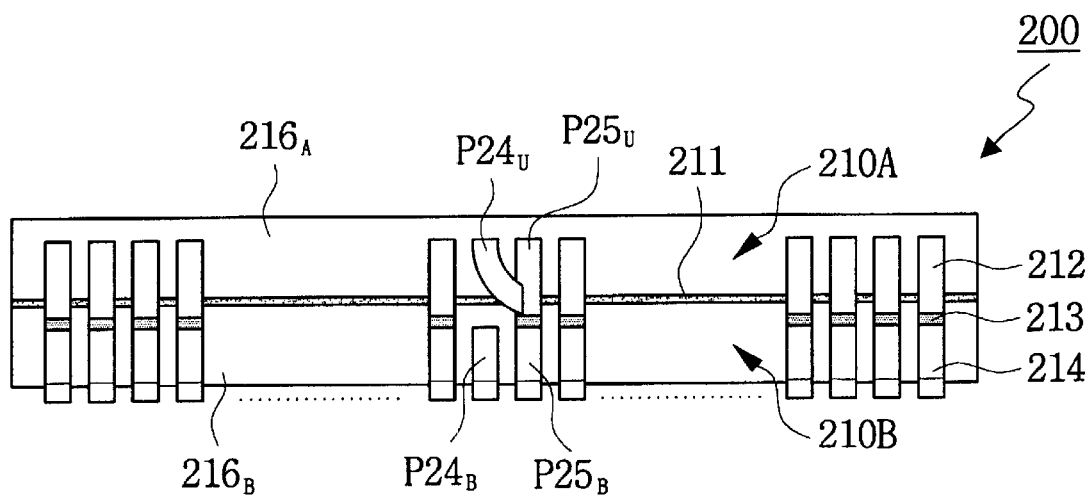
FIG. 2a is a front side view of a package stacked semiconductor device according to the first embodiment of the present invention.
Figure 2B:
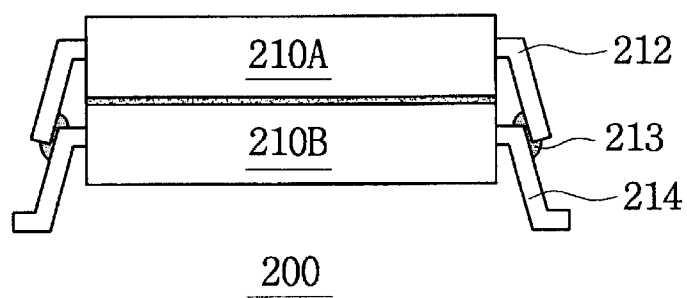

Each of the upper and lower packages 201A and 210B includes package bodies 216A and 216B and a plurality of conductive leads 212 and 214, respectively. The package body may be made of plastic resin, and the conductive leads 212 and 214 are electrically connected to corresponding electrode pads via metal wires. The part of leads connected to the electrode pad is called 'inner lead', while the part of leads exposed from the package body is called 'outer lead'. The outer leads are bent and formed into a proper shape to be mounted onto an external device e.g., a PCB (Printed Circuit Board). In this embodiment, the outer leads may be bent to be a gull-wing shape as shown in FIG. 2b.

The conductive leads include power pins for electric power signals for the chips, address signal pins, data input and output pins, control signal pins and extra NC (No Connection) pins. For instance, as shown in FIG. 3, when the upper and lower semiconductor chips are 512M DDR SDRAM (Double Data Rate Synchronous Dynamic Random Access Memory), the power pins include VDD (power supply), VDDQ (power for DQ), VSS (ground), VSSQ (ground for DQ), VREF (reference voltage), the address pins are A0-A12 and BA0-1(Bank Address), data input and output pins include DQS (Data Strobe) and DQ0-3 (in case of X4), DQ0-7 (in case of X8) or DQ0-15(in case of X16), and control signal pins are CL (Clock), CKE0-1 (Clock Enable), CS0-1 (Chip Select), RAS (Row Address Strobe), CAS (Column Address Strobe), WE (Write Enable) and DM (Data Mask), and NC is used as the extra no connection pin.

Figure 3:
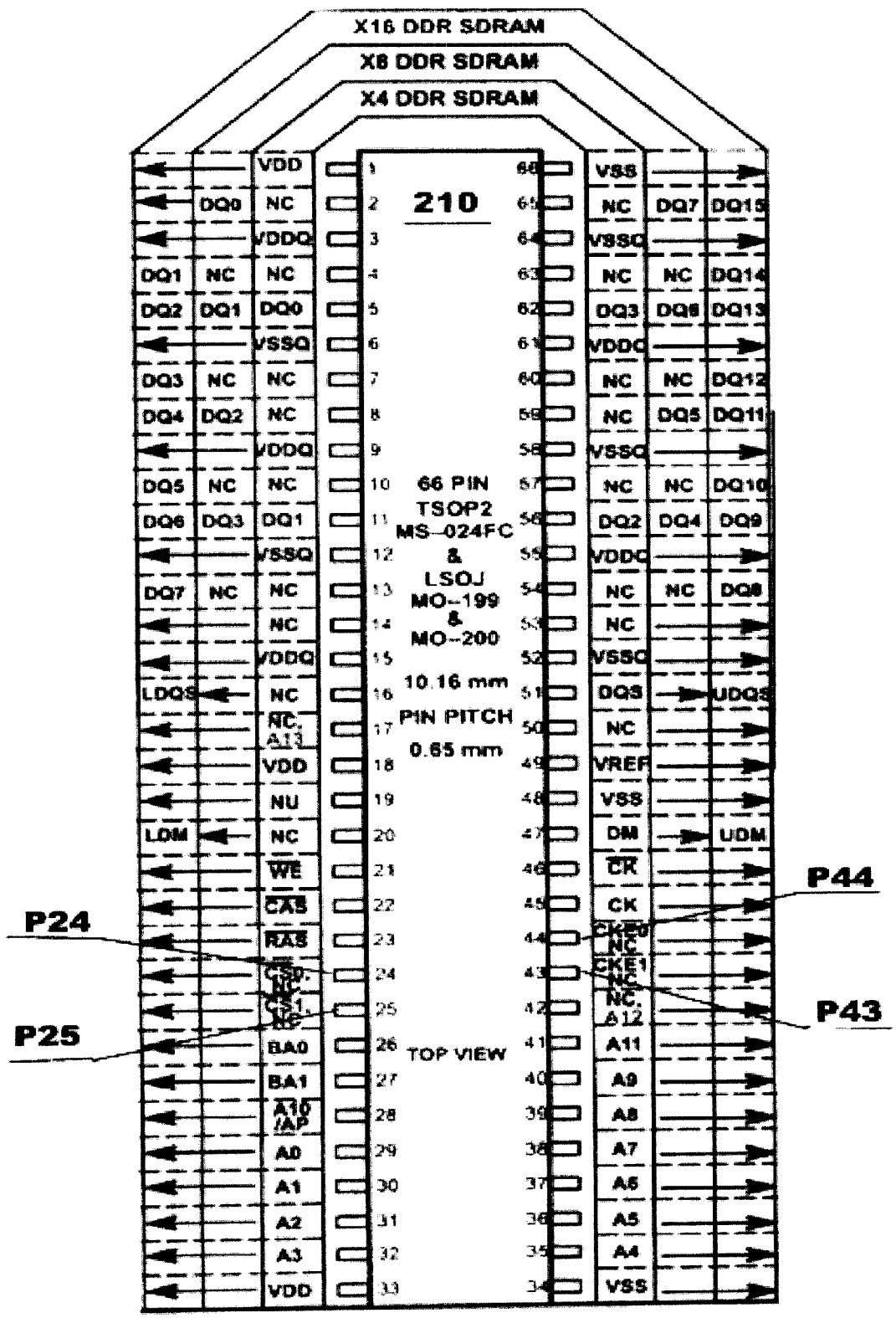
FIG. 3 is a pin configuration of a package suitable for use in the present invention.

FIG. 3 shows the pin configuration of a package device to which the present invention can be applied for the implementation of TSOP2 and LSOJ. The package device has the pin configuration according to JEDEC (Joint Electron Device Engineering Council) standard (JESD79 Release 2) that defines the required aspects of 64 Mb through 1 Gb DDR SDRAM with X4/X8/X16 data interfaces.

Referring to FIG. 3, the pin assignment varies depending on the X4/X8/X16 data interfaces, and CS/ pin 24, NC pin 25, NC pin 43 and CKE pin 44 for non-stacked device are configured to be CS0/ pin 24, CS1/ pin 25, CKE1 pin 43 and CKE0 pin 44 for stacked device, respectively. The CS/ (CS0/, CS1/) pins are for controlling selection of chips, and all commands are masked when CS/ is registered high. CS/ provides for external bank selection on systems with multiple banks. CKE pins are for clock enabling. When high voltage is applied to the CKE pins, internal clock signal and device input buffer and output drivers are activated.

In the present invention, conductive leads of upper package and conductive leads of lower package (including the power pins, address signal pins, data input and output pins and control signal pins) are electrically interconnected in one-to-one method by a pin connection part 213. The pin connection part 213 may be e.g., a solder joint.

The upper and lower packages may be stacked through following processes. Individual packages are prepared by completing outer lead forming, and marking and testing processes. For packages to be used as an upper package in the stacked device, the formed outer leads are reformed to be straightened. This step is not applied to the packages which will be employed as a lower package in the stacked device. The upper package 210A having the reformed straight outer leads is placed over and attached to the lower package 210B with the package bodies 216A and 216B aligned. The attachment of the upper and lower packages may be performed by using an adhesive means 211 such as adhesives and adhesive tapes. It is possible to use the adhesive means having thermal conductive property so that heat generated from the upper and lower packages can be dissipated through the adhesive means 211. The tips of reformed outer leads 212 of the upper package contact the shoulders of outer leads 214 of the lower package, as shown in FIG. 2b. The contacting portions of the outer leads are subjected to e.g., a soldering process to form the pin connection part 213. The soldering includes a solder dipping method. The reformed outer leads 212 of the upper package are elastic and thus adhered closely to the shoulders of outer leads 214 of the lower package, which results in improvement of reliability of the solder pin connection part 213.

It should be noted that at least one lead of the conductive leads of the upper package does not directly connected to corresponding lead of the lower package. In this embodiment, as shown in FIG. 2a, pin $P_{24U}$ of the upper package 210A is disconnected from corresponding pin $P_{24B}$ of the lower package 210B but connected to neighboring pin $P_{25U}$ of the upper package. $P_{25U}$ is one of NC pins and electrically connected to corresponding NC pin $P_{25B}$ of the lower package 210B by the pin connection part 213.

The electrical interconnection of the predetermined pin $P_{24U}$ to neighboring NC pin $P_{25U}$ and corresponding NC pin $P_{25B}$ of the lower package instead of $P_{24B}$ can be implemented in various embodiments.

In the first embodiment, as shown in FIG. 2a, pin $P_{24U}$ may be bent to contact neighboring NC pin $P_{25U}$. In this stacked package device, pin $P_{24U}$ of the upper package 210A is provided with a control signal e.g., CS0 from an external device through the NC pin $P_{25B}$ of the lower package 210B, and pin $P_{24B}$ of the lower package 201B is provided with a control signal e.g., CS1, so that the upper and lower packages can be selected. With reference to the pin configuration shown in FIG. 3, a control signal of CKE can be selectively provided to the upper and lower packages by making CKE pin 44 of the upper package be contacted to neighboring NC pin 43.

Figure 4A:
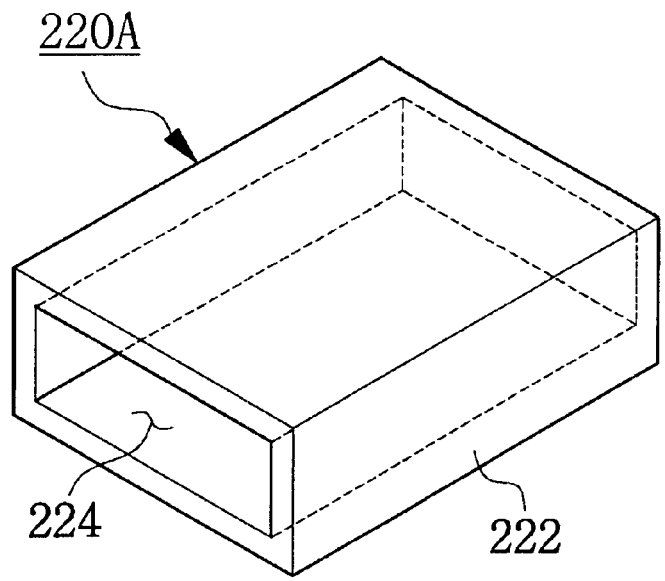
FIG. 4a is a perspective view of a pin linking means used in a package stacked semiconductor device according to the second embodiment of the present invention.
Figure 4B:
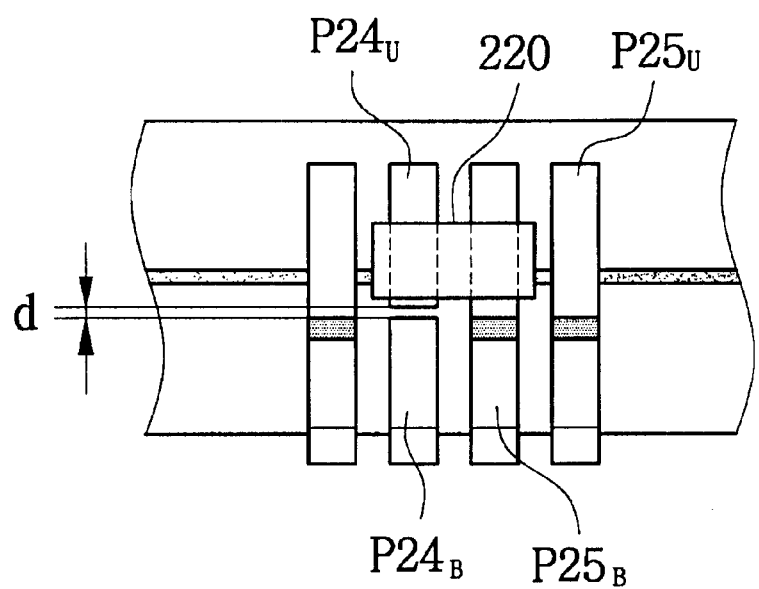

FIG. 4a is a perspective view of the package stacked semiconductor device according to the second embodiment of the present invention, and FIG. 4b is a partial enlarged view of a pin linking means of the stacked device shown in FIG. 4a.

In the second embodiment, a predetermined pin (e.g., $P_{24U}$) of the upper package 210A is not re-formed or bent. Instead pin $P_{24U}$ is electrically interconnected to the neighboring NC pin P25u by using a jumper 220. The jumper 220 is made of metal and includes an electrically conductive body 222 and central perforated part 224. Two neighboring leads $P_{24U}$ and $P_{25U}$ are inserted into the perforated part 224 and contacted to inner walls of the perforated part 224 so that two inserted pins are electrically interconnected by the conductive body 222 of the jumper 220. In this embodiment, pin $P_{24U}$ of the upper package 210A should be made shortened to be distant by a predetermined distance 'd' from corresponding pin $P_{24B}$ of the lower package 210B.

Figure 4C:
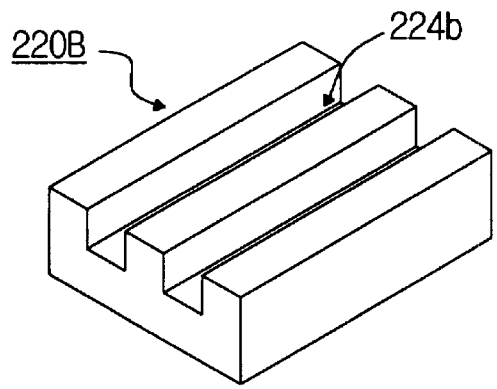
FIG. 4c is a perspective view of a pin linkage used in package stacked semiconductor device according to the second embodiment of the present invention with modification, illustrating two parallel through grooves.
Figure 4D:
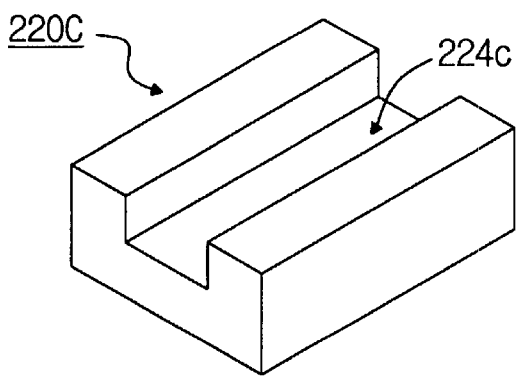
FIG. 4d is a perspective view of a pin linkage used in a package stacked semiconductor device according to the second embodiment of the present invention, with modification, illustrated one through groove.

The jumper of this embodiment may be modified to have one through groove (FIG. 4d, 224c) or two parallel through grooves (FIG. 4c, 224b) in one surface to receive the leads $P_{24U}$ and $P_{25U}$ instead of having the perforated part 224 (FIG. 4a).

Figure 5:
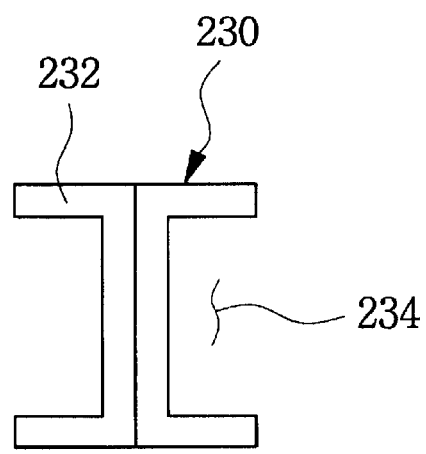
FIG. 5 is a cross-sectional view of a pin linking means used in a package stacked semiconductor device according to the third embodiment of the present invention.

FIG. 5 is a cross-sectional view of a pin linking means suitable for use in third embodiment of the present invention.

The jumper means 230 of the third embodiment is different from the jumper 220 of the second embodiment in that it does not have the central perforated part but has a shape of slanted 'H'. That is, the jumper means 230 of the third embodiment includes an electrically conductive body 232 and openings 234 at both sides of the body 232. The leads $P_{24U}$ and $P_{25U}$ of the upper package 210A are adhered to the conductive body 232 through the openings 234 and electrically interconnected.

FIG. 6 is a planar cross-sectional view of a pin linking means used in fourth embodiment of the present invention.

Figure 6A:
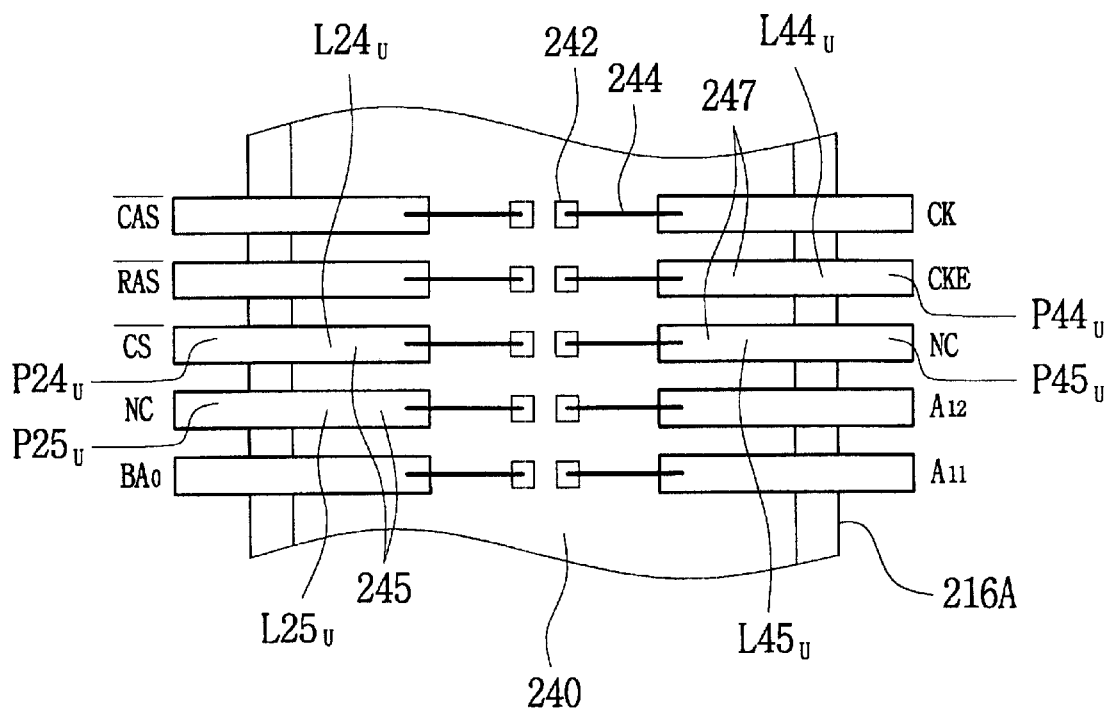
FIGS. 6a and 6b are cross-sectional plan views of a pin linking means used in a package stacked semiconductor device according to the fourth embodiment of the present invention.

Unlike the first to the third embodiments, a pin linking means in the fourth embodiment is implemented in the internal structure of individual package. Referring to FIG. 6a, as the pin linking means, a ribbon wire 245 is used to electrically connect an inner lead $L_{24U}$ for a semiconductor chip 240 encapsulated within the upper package 210A and a neighboring NC lead $L_{25U}$, and another ribbon wire 247 connects an inner lead $L_{44U}$ and neighboring NC lead $L_{43U}$.

Figure 6B:
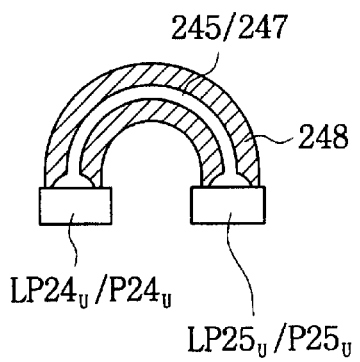

Remaining leads excepting the NC leads $L_{25U}$ and $L_{43U}$ are electrically interconnected to corresponding electrode pads 242 of the chip 240. The ribbon wires 245 and 247 may be protected by soldering 248 as shown in FIG. 6b.

Figure 7A:
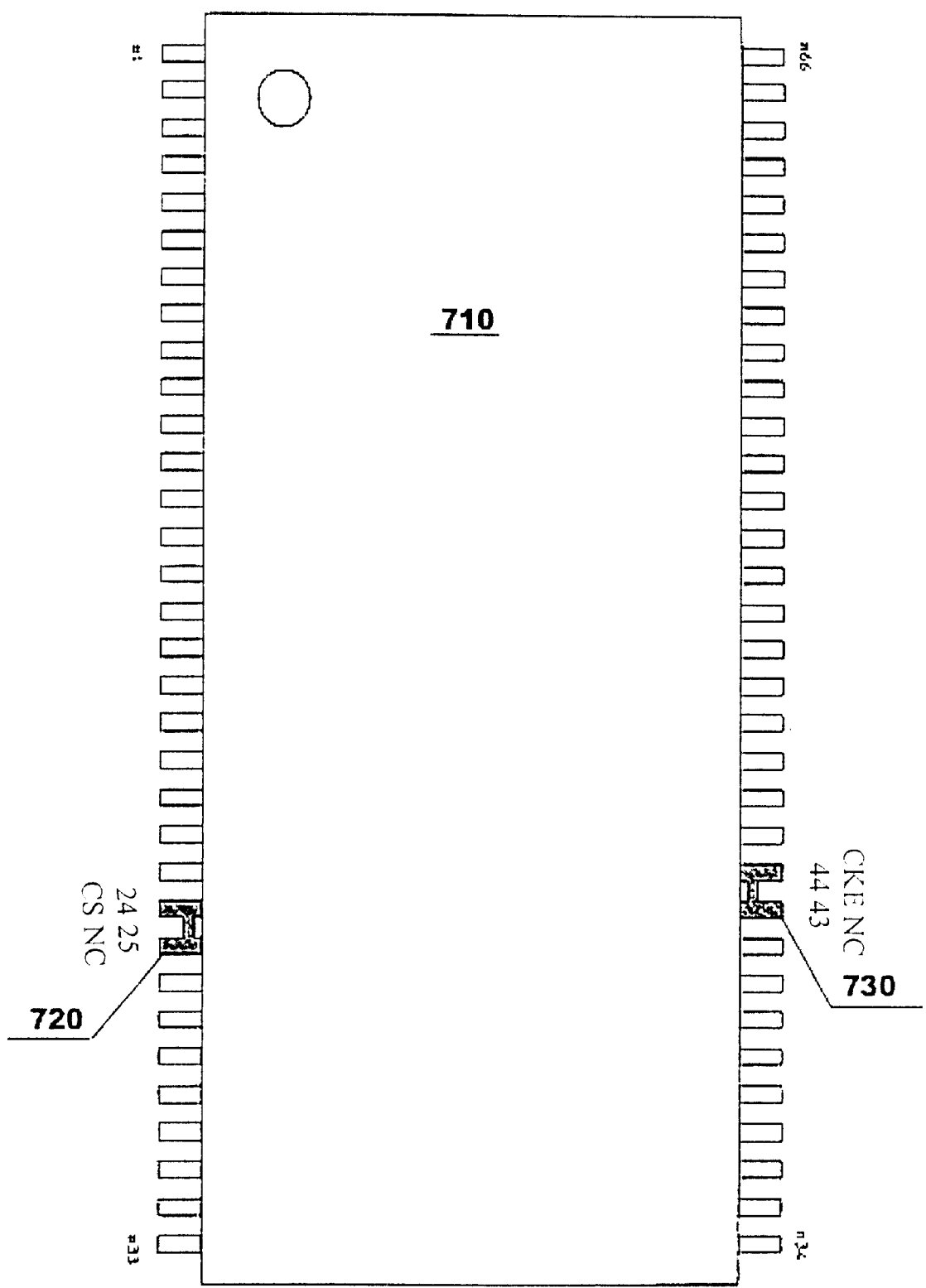
FIG. 7a is a plan view of a package stacked semiconductor device according to the fifth embodiment of the present invention.
Figure 7B:
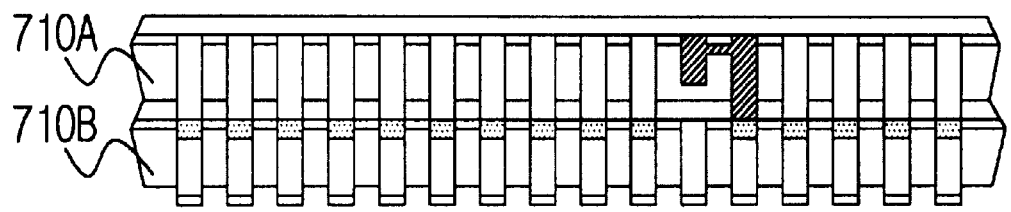

FIG. 7a is a plan view of a package stacked semiconductor device according to fifth embodiment of the present invention, and FIG. 7b is a front side view of the stacked device of FIG. 7a.

In the fifth embodiment, parts of dam bar 720 and 730 of a lead frame for the upper package 710A are remained without cut off so that predetermined control pins of the upper package can be electrically interconnected to external world through NC pins of the lower package. For example, as shown in FIG. 7a, a dam bar 720 between CS/ pin 24 and NC pin 25 of the upper package 710A and a dam bar 730 between NC pin 43 and CKE pin 44 are not cut off during an assembly process for the upper package. In general, the dam bar is a component included in a lead frame for preventing an overflow of mold resin in a molding process. After the formation of the package mold body, the dam bar is cut off in order for the individual leads to be electrically separated. However, in this embodiment, parts of the dam bar 720 and 730 are not cut off for electrical interconnection of NC pin lead and some control pin leads.

Referring to FIG. 7b, NC pin and CS/ pin of the upper package 710A are connected by the dam bar 720 and the NC pin of the upper package is connected to an NC pin of the lower package 710B. Therefore, it is possible to supply from external device a control signal to CS/ pin of the upper package through the NC pin of the lower package. The length of the CS/ pin should be shortened so as not to contact the corresponding CS/ pin of the lower package. By doing this, it is made possible to provide with CS0/ signal to pin 24 of the upper package 710A and CS1/ signal to pin 24 of the lower package 710B. To the pin 24 of the upper package 710A, CS0 signal is supplied via a route from pin 25 of the lower package→pin 25 of the upper package→dam bar— pin 24 of the upper package. Supply of CKE0 and CKE1 signals may be performed in the same manner.

According to the fifth embodiment of the present invention, stacked two packages operates as a single semiconductor IC device by using existing structure of a lead frame, i.e., a dam bar, and thus there is no need of additional elements for the operation of stacked device, which leads to minimization of addition or modification of processes or facilities.

Figure 8:
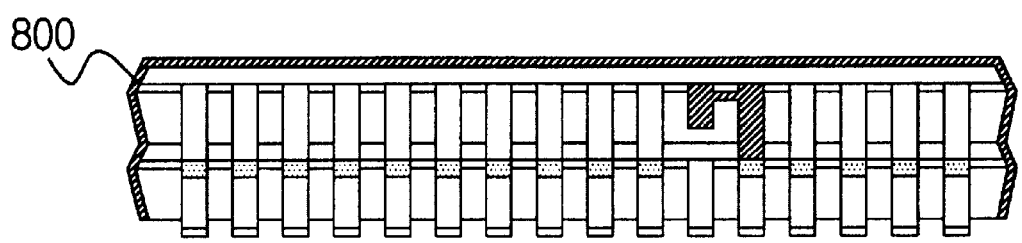
FIGS. 8 and 9 are front side views of package stacked semiconductor devices having a heat dissipation means according to the second embodiment of the present invention.
Figure 9:
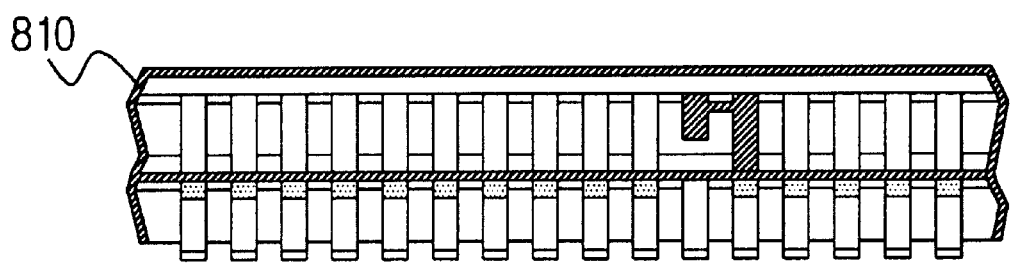

FIGS. 8 and 9 are plan views of package stacked semiconductor device having a heat dissipation means according to seventh embodiment of the present invention.

The heat dissipation means 800 and 810 are a plate made of metal having good thermal conductivity e.g., a copper (Cu), and attached to the upper surface of the upper package and sides of the upper and lower packages. As shown in FIG. 9, it is possible to form an additional heat dissipation means 810 between the interface of the upper and lower packages.

Figure 10:
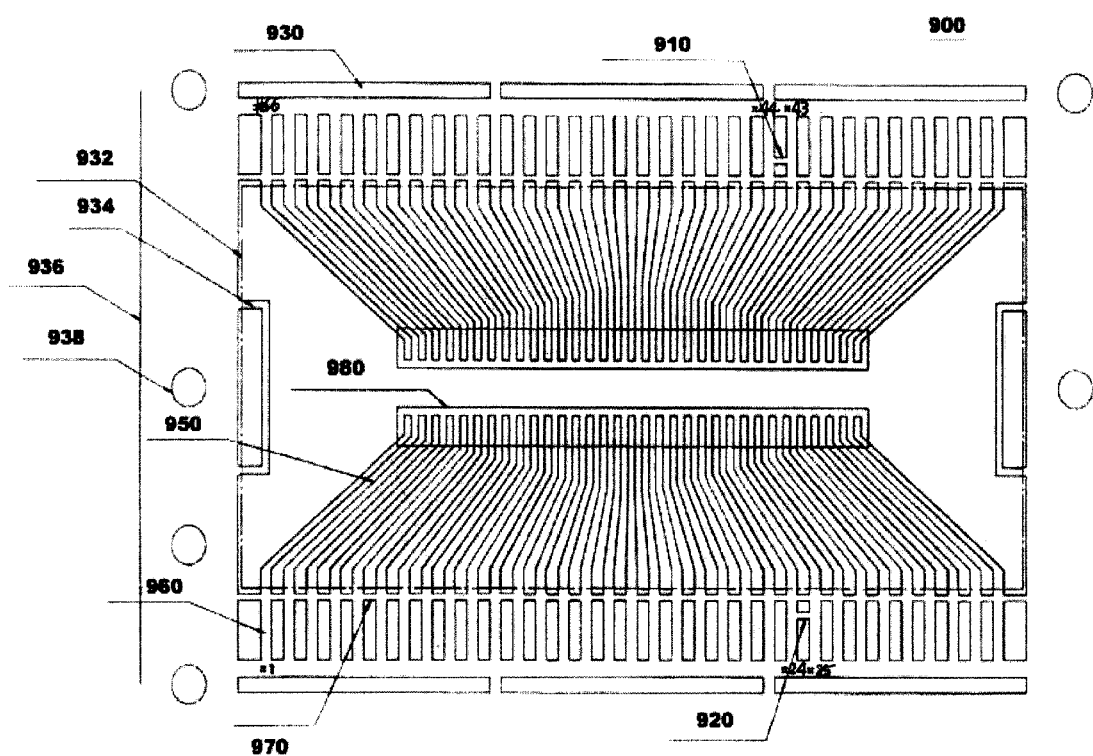
FIG. 10 is a plan view of a lead frame having bridge leads according to the seventh embodiment of the present invention.

FIG. 10 is a plan view of a lead frame suitable for use in the package stacked semiconductor device according to seventh embodiment of the present invention.

In this embodiment, when assembling an upper package for the stacked device, bridge leads 910 and 920 are formed as parts of leads of a lead frame e.g., to electrically interconnect leads 24 and 25 and leads 43 and 44. The lead frame shown in FIG. 10 includes a unit slit hole 930, a molding line 932 defining the area in which a package body is formed, a tie bar 934, strip rails 936, feeding holes 938, inner leads 950, outer leads 960 and dam bars 970. If the lead frame is of LOC (Lead On Chip) structure, an adhesive film 980 can be attached to the tips of the inner leads 950. The bridge leads 910 and 920 may be formed outside the dam bar 970, between the two adjacent outer leads (960).

When stacking the upper package having the bridge leads 910 and 920 onto the lower package, one of the outer leads of the upper package (for example, pin lead 24 and pin lead 43) should be made shortened for preventing it from contacting the corresponding outer lead of the lower package. By doing this, like the previous embodiment, it is possible to provide CS0/ signal to pin of the upper package and CS1/ signal to pin 24 of the lower package, and/or CKE0 signal to pin 44 of the upper package and CKE1 signal to pin 44 of the lower package. In the seventh embodiment, the stacked device operates as intended by simply changing the structure of outer leads without selectively cutting the dam bar.

In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. A semiconductor device comprising a plurality of vertically stacked semiconductor chip packages, each of said packages comprising a semiconductor chip; a plurality of electrode pads on the chip at its active surface; and a plurality of conductive leads for electrically connecting the electrode pads to external world;

each of said conductive leads including power pins for power signal for the semiconductor chip; data pins for inputting and outputting data to and from the semiconductor chip; control signal pins; and no connection (NC) pins;

wherein said device comprises a plurality of pin connection parts for connecting the conductive leads of one package ("first package") to the respective corresponding conductive leads of the next stacked package ("second package"); and wherein said first package comprises at least one control signal ("coupling CS pin") and at least one NC pin ("coupling NC pin"), which are next to each other; said coupling CS pin being coupled to said coupling NC pin in such a way that they are electrically connected; and only one of said coupling CS pin or said coupling NC pin being electrically connected to the corresponding pin of the second package.

2. The semiconductor device of claim 1, wherein the coupling CS pin is a chip selection control pin or a clock signal control pin.

3. The semiconductor device of claim 1, wherein the coupling NC pin is coupled to the coupling NC pin by way of an electrically conductive pin linking means.

4. The semiconductor device of claim 3, wherein said pin linking means is an electrically conductive jumper having a through hole formed inside thereof so that the coupling NC pin and the coupling CS pin may be inserted into and in contact with the interior surface of the hole.

5. The semiconductor device of claim 3, wherein said pin linking means is an electrically conductive jumper having an opening at two opposite ends so as to receive the coupling CS pin and the coupling NC pin, respectively, and the coupling CS pin and the coupling NC pin are in contact with the interior surface of the openings.

6. The semiconductor device of claim 3, wherein said pin linking means is an electrically conductive jumper having one through groove or two parallel through grooves in one side thereof to receive the coupling NC pin and the coupling CS pin, respectively, and the coupling CS pin and the coupling NC pin are in contact with the groove(s).

7. The semiconductor device of claim 3, wherein each of said coupling NC pin and said coupling CS pin has an inner lead, and wherein said pin linking means is an electrically conductive ribbon wire coupling the inner lead of the coupling NC pin to the inner lead of the coupling CS pin.

8. The semiconductor device of claim 3, wherein said pin linking means is a dam bar.

9. The semiconductor device of claim 3, wherein said pin linking means is a bridge lead.

10. The semiconductor device of claim 9, wherein the conductive leads of the first package are comprised of inner lead and outer leads; and the bridge lead is formed between the outer lead part of the coupling CS pin and the outer lead part of the coupling NC pin.

11. The semiconductor device of claim 1, wherein the first and the second packages have identical structure and function.

12. The semiconductor device of claim 11, wherein the first and the second packages have an identical semiconductor chip, which is DDR SDRAM (Double Data Rate Synchronous Random Access Memory) device.

13. The semiconductor device of claim 1, wherein said plurality of semiconductor chip packages further comprise a package body for encapsulating the semiconductor chip and a part of the conductive leads.

14. The semiconductor device of claim 1 further comprises a heat dissipation means attached to at least one outer surface of the first package.

15. A semiconductor device comprising a plurality of vertically stacked semiconductor chip packages, each of said packages comprising a semiconductor chip; a plurality of electrode pads on the chip at its active surface; a plurality of conductive leads for electrically connecting the electrode pads to external world; and a package body for encapsulating the semiconductor chip and a part of the conductive leads;

each of said conductive leads including power pins for power signal for the semiconductor chip; data pins for inputting and outputting data to and from the semiconductor chip; control signal pins; and no connection (NC) pins;

wherein said device comprises a plurality of pin connection parts for connecting the conductive leads of one package ("first package") to the respective corresponding conductive leads of the next stacked package ("second package");

wherein said first package comprises at least one control signal ("coupling CS pin"), which is not connected to the corresponding pin of the second package, and at least one NC pin ("coupling NC pin") which is next to the coupling CS pin; said coupling CS pin being coupled to said coupling NC pin in such a way that they are electrically connected; and said coupling CS pin being electrically connected to an NC of the second package, which corresponds to said coupling NC pin.

16. The semiconductor device of claim 15, wherein the coupling CS pin is bent toward to the coupling NC pin in such a way that the former is in direct contact with the later.

* * * * *